US009070833B2

(12) United States Patent
Chuang et al.

(10) Patent No.: US 9,070,833 B2

(45) Date of Patent: Jun. 30, 2015

(54) DISTRIBUTED CURRENT BLOCKING STRUCTURES FOR LIGHT EMITTING DIODES

(71) Applicant: KABUSHIKI KAISHA TOSHIBA, Tokyo (JP)

(72) Inventors: Chih-Wei Chuang, Albany, CA (US); Chao-Kun Lin, San Jose, CA (US)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 51 days.

(21) Appl. No.: 13/967,982

(22) Filed: Aug. 15, 2013

(65) Prior Publication Data

US 2014/0054640 A1 Feb. 27, 2014

Related U.S. Application Data

(63) Continuation of application No. 13/198,664, filed on Aug. 4, 2011, now Pat. No. 8,564,010.

(51) Int. Cl.
*H01L 33/14* (2010.01)
*H01L 33/38* (2010.01)
(Continued)

(52) U.S. Cl.
CPC ................. *H01L 33/38* (2013.01); *H01L 33/14* (2013.01); *H01L 33/145* (2013.01); *H01L 33/22* (2013.01);
(Continued)

(58) Field of Classification Search
CPC ....... H01L 33/145; H01L 33/14; H01L 33/38; H01L 33/387
USPC .................... 257/79–103, E33.001–E33.077; 438/22–47
See application file for complete search history.

(56) References Cited

U.S. PATENT DOCUMENTS 5,306,662 A 4/1994 Nakamura et al.
5,408,120 A 4/1995 Manabe et al.
(Continued)

FOREIGN PATENT DOCUMENTS

CN 201349018 Y 11/2009
JP 2803741 9/1904
(Continued)

OTHER PUBLICATIONS

Mike Cooke, High-Brightness Nitride LEDs on Silicon Through Wafer Bondings, Jun. 4, 2011, (URL http://www.semiconductor-today.com/news_items/2011/JUNE/KOREAPHOTONICS_040611.HTML) (4 Pages).
(Continued)

*Primary Examiner* — Steven J Fulk
*Assistant Examiner* — Eric Ward
(74) *Attorney, Agent, or Firm* — Hogan Lovells US LLP

(57) ABSTRACT

An LED device includes a strip-shaped electrode, a strip-shaped current blocking structure and a plurality of distributed current blocking structures. The current blocking structures are formed of an insulating material such as silicon dioxide. The strip-shaped current blocking structure is located directly underneath the strip-shaped electrode. The plurality of current blocking structures may be disc shaped portions disposed in rows adjacent the strip-shaped current blocking structure. Distribution of the current blocking structures is such that current is prevented from concentrating in regions immediately adjacent the electrode, thereby facilitating uniform current flow into the active layer and facilitating uniform light generation in areas not underneath the electrode. In another aspect, current blocking structures are created by damaging regions of a p-GaN layer to form resistive regions. In yet another aspect, current blocking structures are created by etching away highly doped contact regions to form regions of resistive contact between conductive layers.

17 Claims, 6 Drawing Sheets

TOP-DOWN DIAGRAM OF AN LED DEVICE WITH DISTRIBUTED CURRENT BLOCKING STRUCTURES

(51) Int. Cl.
*H01L 33/22* (2010.01)
*H01L 33/40* (2010.01)
*H01L 33/42* (2010.01)

(52) U.S. Cl.
CPC ............. *H01L 33/387* (2013.01); *H01L 33/405* (2013.01); *H01L 33/42* (2013.01); *H01L 2933/0016* (2013.01)

(56) References Cited

U.S. PATENT DOCUMENTS

| | | | | |
|---|---|---|---|---|
| 5,432,808 | A | 7/1995 | Hatano et al. | 372/45.01 |
| 5,468,678 | A | 11/1995 | Nakamura et al. | |
| 5,563,422 | A | 10/1996 | Nakamura et al. | |
| 5,578,839 | A | 11/1996 | Nakamura et al. | |
| 5,734,182 | A | 3/1998 | Nakamura et al. | |
| 5,747,832 | A | 5/1998 | Nakamura et al. | |
| 5,753,939 | A | 5/1998 | Sassa et al. | |
| 5,766,783 | A | 6/1998 | Utsumi et al. | 428/698 |
| 5,777,350 | A | 7/1998 | Nakamura et al. | |
| 5,959,307 | A | 9/1999 | Nakamura et al. | |
| 5,959,401 | A | 9/1999 | Asami et al. | |
| 5,977,566 | A | 11/1999 | Okazaki et al. | |
| 6,005,258 | A | 12/1999 | Manabe et al. | |
| 6,040,588 | A | 3/2000 | Koide et al. | |
| RE36,747 | E | 6/2000 | Manabe et al. | |
| 6,121,635 | A | 9/2000 | Watanabe et al. | 257/91 |
| 6,191,436 | B1 | 2/2001 | Shibata et al. | |
| 6,215,133 | B1 | 4/2001 | Nakamura et al. | |
| 6,242,764 | B1 | 6/2001 | Ohba et al. | 257/190 |
| 6,265,726 | B1 | 7/2001 | Manabe et al. | |
| 6,326,236 | B1 | 12/2001 | Koide et al. | |
| 6,420,733 | B2 | 7/2002 | Koide et al. | |
| 6,445,007 | B1 * | 9/2002 | Wu et al. | 257/80 |
| 6,541,293 | B2 | 4/2003 | Koide et al. | |
| 6,610,995 | B2 | 8/2003 | Nakamura et al. | |
| 6,617,060 | B2 | 9/2003 | Weeks, Jr. et al. | 428/698 |
| 6,621,106 | B2 | 9/2003 | Murakami et al. | |
| 6,657,236 | B1 | 12/2003 | Thibeault et al. | |
| 6,800,500 | B2 | 10/2004 | Coman et al. | |
| 6,838,693 | B2 | 1/2005 | Kozaki | |
| 6,849,881 | B1 | 2/2005 | Harle et al. | |
| 6,891,197 | B2 | 5/2005 | Bhat et al. | |
| 6,906,352 | B2 | 6/2005 | Edmond et al. | |
| 6,916,676 | B2 | 7/2005 | Sano et al. | |
| 6,936,864 | B2 | 8/2005 | Kondo | |
| 6,951,695 | B2 | 10/2005 | Xu et al. | |
| 6,977,395 | B2 | 12/2005 | Yamada et al. | |
| 7,026,653 | B2 | 4/2006 | Sun | |
| 7,106,090 | B2 | 9/2006 | Harle et al. | |
| 7,115,908 | B2 | 10/2006 | Watanabe et al. | |
| 7,138,286 | B2 | 11/2006 | Manabe et al. | |
| 7,193,246 | B1 | 3/2007 | Tanizawa et al. | |
| 7,247,985 | B2 | 7/2007 | Kaneko et al. | 313/506 |
| 7,262,436 | B2 | 8/2007 | Kondoh et al. | |
| 7,312,474 | B2 | 12/2007 | Emerson et al. | |
| 7,335,920 | B2 | 2/2008 | Denbaars et al. | |
| 7,345,297 | B2 | 3/2008 | Yamazoe et al. | |
| 7,348,602 | B2 | 3/2008 | Tanizawa | |
| 7,402,838 | B2 | 7/2008 | Tanizawa et al. | |
| 7,442,966 | B2 | 10/2008 | Bader et al. | |
| 7,446,345 | B2 | 11/2008 | Emerson et al. | |
| 7,491,565 | B2 | 2/2009 | Coman et al. | |
| 7,547,908 | B2 | 6/2009 | Grillot et al. | |
| 7,547,925 | B2 | 6/2009 | Wong et al. | 257/103 |
| 7,560,737 | B2 | 7/2009 | Murofushi et al. | |
| 7,611,917 | B2 | 11/2009 | Emerson et al. | |
| 7,691,651 | B2 | 4/2010 | Park | 438/22 |
| 7,709,851 | B2 | 5/2010 | Bader et al. | |
| 7,728,340 | B2 * | 6/2010 | Unno et al. | 257/98 |
| 7,737,459 | B2 | 6/2010 | Edmond et al. | |
| 7,754,514 | B2 | 7/2010 | Yajima et al. | |
| 7,763,898 | B2 * | 7/2010 | Tanaka et al. | 257/87 |
| 7,791,061 | B2 | 9/2010 | Edmond et al. | |
| 7,791,101 | B2 | 9/2010 | Bergmann et al. | |
| 7,795,623 | B2 | 9/2010 | Emerson et al. | |
| 7,813,400 | B2 | 10/2010 | Denbaars et al. | 372/45.011 |
| 7,910,945 | B2 | 3/2011 | Donofrio et al. | |
| 7,939,844 | B2 | 5/2011 | Hahn et al. | |
| 7,947,994 | B2 | 5/2011 | Tanizawa et al. | |
| 7,968,865 | B2 | 6/2011 | LaRoche et al. | 257/11 |
| 7,989,834 | B2 | 8/2011 | Park | |
| 8,021,904 | B2 | 9/2011 | Chitnis | |
| 8,030,665 | B2 | 10/2011 | Nagahama et al. | |
| 2001/0050530 | A1 | 12/2001 | Murakami et al. | |
| 2003/0178642 | A1 | 9/2003 | Tanaka et al. | 257/200 |
| 2004/0016934 | A1 | 1/2004 | Murakami et al. | |
| 2007/0210304 | A1 | 9/2007 | Komiyama et al. | 257/40 |
| 2008/0185606 | A1 * | 8/2008 | Sano et al. | 257/98 |
| 2008/0246047 | A1 | 10/2008 | Hsu et al. | |
| 2008/0317081 | A1 | 12/2008 | Kushibe et al. | |
| 2009/0045434 | A1 | 2/2009 | Muraki et al. | |
| 2009/0101933 | A1 * | 4/2009 | Takao et al. | 257/99 |
| 2009/0179211 | A1 * | 7/2009 | Yoo et al. | 257/98 |
| 2010/0072487 | A1 * | 3/2010 | Tsai et al. | 257/86 |
| 2010/0072508 | A1 * | 3/2010 | Kamiya et al. | 257/99 |
| 2010/0148189 | A1 * | 6/2010 | Fang et al. | 257/79 |
| 2010/0207160 | A1 * | 8/2010 | Park | 257/103 |
| 2010/0320478 | A1 | 12/2010 | Lin et al. | |
| 2011/0062487 | A1 * | 3/2011 | Oh | 257/99 |
| 2011/0084298 | A1 * | 4/2011 | Lai | 257/98 |
| 2011/0140161 | A1 * | 6/2011 | Lim et al. | 257/99 |
| 2011/0147790 | A1 * | 6/2011 | Chen | 257/101 |
| 2012/0037952 | A1 | 2/2012 | Lin et al. | |
| 2012/0097918 | A1 * | 4/2012 | Yu et al. | 257/13 |

FOREIGN PATENT DOCUMENTS

| | | | |
|---|---|---|---|
| JP | 4267376 | A | 2/1991 |
| JP | 4267376 | A | 9/1992 |
| JP | 05291620 | A | 11/1993 |
| JP | 2626431 | | 5/1994 |
| JP | 2681733 | | 5/1994 |
| JP | 2917742 | | 6/1994 |
| JP | 2827794 | | 8/1994 |
| JP | 2778405 | | 9/1994 |
| JP | 2803741 | | 9/1994 |
| JP | 2785254 | | 1/1995 |
| JP | 8264894 | A | 3/1995 |
| JP | 2735057 | | 3/1996 |
| JP | 2956489 | | 3/1996 |
| JP | 8264894 | A | 10/1996 |
| JP | 2666237 | | 12/1996 |
| JP | 2890396 | | 12/1996 |
| JP | 3250438 | | 12/1996 |
| JP | 09-036482 | | 2/1997 |
| JP | 3135041 | | 6/1997 |
| JP | 11040847 | A | 7/1997 |
| JP | 3209096 | | 12/1997 |
| JP | 3506874 | | 1/1998 |
| JP | 3654738 | | 2/1998 |
| JP | 3795624 | | 2/1998 |
| JP | 3304787 | | 5/1998 |
| JP | 3344257 | | 8/1998 |
| JP | 3223832 | | 9/1998 |
| JP | 3374737 | | 12/1998 |
| JP | 11040847 | A | 2/1999 |
| JP | 3314666 | | 3/1999 |
| JP | 4118370 | | 7/1999 |
| JP | 4118371 | | 7/1999 |
| JP | 3548442 | | 8/1999 |
| JP | 3622562 | | 11/1999 |
| JP | 2010-129812 | | 6/2000 |
| JP | 3424629 | | 8/2000 |
| JP | 4860024 | | 8/2000 |
| JP | 3063756 | | 9/2000 |
| JP | 4629178 | | 9/2000 |
| JP | 3063757 | | 10/2000 |
| JP | 3511970 | | 10/2000 |
| JP | 2000-351692 | | 12/2000 |
| JP | 3748011 | B2 | 12/2000 |
| JP | 3551101 | | 5/2001 |
| JP | 3427265 | | 6/2001 |
| JP | 001274456 | A | 10/2001 |

(56) References Cited

FOREIGN PATENT DOCUMENTS

| | | | |
|---|---|---|---|
| JP | 3646649 | | 10/2001 |
| JP | 3780887 | | 5/2002 |
| JP | 3890930 | | 5/2002 |
| JP | 3786114 | | 4/2004 |
| JP | 4904261 | | 6/2004 |
| JP | 2004179491 | A | 6/2004 |
| JP | 2005-108917 | | 4/2005 |
| JP | 2005-136443 | | 5/2005 |
| JP | 2006-286758 | | 10/2006 |
| JP | 2007165515 | A | 6/2007 |
| JP | 2010-129812 | | 6/2010 |
| TW | 201023401 | A1 | 6/2010 |

OTHER PUBLICATIONS

Dadgar et al., Epitaxy of GaN on silicon-impact of symmetry and surface reconstruction, New Journal of Physics, vol. 9, No. 389 (2007); IOP Publishing Ltd., http://iopscience.iop.org/1367-2630/9/10/389 (10 pages).

Bae et al., Surface Investigation of a Cubic AIN Buffer Layer and GaN Grown on Si(111) and Si(100) as Revealed by Atomic Force Microscopy, Journal of the Korean Physical Society, vol. 49, No. 3, Sep. 2006, pp. 1092-1096 (5 pages).

Keyan et al., Structural analysis of metalorganic chemical vapor deposited AIN nucleation layers on Si(111), Singapore—MIT Alliance, Jan. 2004, citable URL: http://hdl.handle.net/1721.1/3841 (4 pages).

International Search Report and Written Opinion by Korean Intellectual Property Office (KIPO) as international searching authority (ISA) in the related international application PCT/US2012/041243 dated Feb. 26, 2013 (111 pages).

International Search Report and Written Opinion by the Korean Intellectual Property Office (KIPO) as international searching authority (ISA) in the related international application PCT/US2012/041243 dated Feb. 26, 2013 (11 pages).

Mike Cooke, "High-Brightness Nitride LEDs on Silicon Through Wafer Bonding", Jun. 4, 2011. (URL: "http://www.semiconductor-today.com/news_items/2011/JUNE/KOREAPHOTONICS_040611.html") (4 pages).

Dadgar et al., "Epitaxy of GaN on silicon—impact of symmetry and surface reconstruction," New Journal of Physics, vol. 9, No. 389 (2007); IOP Publishing Ltd., http://iopscience.iop.org/1367-2630/9/10/389 (10 pages).

Bae et al., "Surface Investigation of a Cubic AlN Buffer Layer and GaN Grown on Si(111) and Si(100) as Revealed by Atomic Force Microscopy," Journal of the Korean Physical Society, vol. 49, No. 3, Sep. 2006, pp. 1092-1096 (5 pages).

Keyan et al., "Structural analysis of metalorganic chemical vapor deposited AlN nucleation layers on Si(111)," Singapore—MIT Alliance, Jan. 2004, citable URI: http://hdl.handle.net/1721.1/3841 (4 pages).

Taiwan Office Action dated Sep. 16, 2014, corresponds Taiwan Application No. 101120367.

Japanese Office Action dated Dec. 16, 2014 corresponding to Japanese Application No. 2014-523924.

* cited by examiner

CROSS-SECTIONAL VIEW OF A CONVENTIONAL LATERAL LED DEVICE

CROSS-SECTIONAL VIEW OF A CONVENTIONAL VERTICAL LED DEVICE

TOP-DOWN DIAGRAM OF AN LED DEVICE WITH DISTRIBUTED CURRENT BLOCKING STRUCTURES

CROSS-SECTIONAL SIDE VIEW OF A GENERIC LED DEVICE

TOP-DOWN VIEW OF THE GENERIC LED DEVICE OF FIG. 4

SCHEMATIC DIAGRAM ILLUSTRATING RESISTANCE OF AREAS A, B, AND C

CROSS-SECTIONAL SIDE VIEW OF A VERTICAL LED DEVICE WITH DISTRIBUTED CURRENT BLOCKING STRUCTURES TAKEN ALONG LINE B-B

CURRENT BLOCKING STRUCTURES FORMED BY DAMAGING p++GaN AND p-GaN MATERIAL IN SELECTED PLACES

CURRENT BLOCKING STRUCTURES FORMED BY ETCHING AWAY p++GaN LAYER IN SELECTED PLACES

CROSS-SECTIONAL SIDE VIEW OF A LATERAL LED DEVICE WITH DISTRIBUTED CURRENT BLOCKING STRUCTURES

DISTRIBUTED CURRENT BLOCKING STRUCTURES FOR LIGHT EMITTING DIODES

The present application is a Continuation of U.S. application Ser. No. 13/198,664, filed Aug. 4, 2011, pending, the contents of which are all herein incorporated by this reference in their entireties. All publications, patents, patent applications, databases and other references cited in this application, all related applications referenced herein, and all references cited therein, are incorporated by reference in their entirety as if restated here in full and as if each individual publication, patent, patent application, database or other reference were specifically and individually indicated to be incorporated by reference.

TECHNICAL FIELD

The present disclosure relates generally to semiconductor light emitting devices and particularly to the efficient generation of light in semiconductor light emitting devices.

BACKGROUND INFORMATION

A Light Emitting Diode (LED) is a solid state device that converts electrical energy to light. Light is emitted from an active layer of semiconductor materials sandwiched between oppositely doped layers when a voltage is applied across the doped layers. The efficiency of an LED structure at converting energy to light determines whether the LED is suitable for certain applications. For example, use of LEDs in lighting applications requires high efficiency, reliability, and low cost. Advances in semiconductor materials and improvement in LED architectures have led to improvement in efficiency.

U.S. Pat. No. 6,121,635 to Watanabe discloses a current blocking layer positioned below a top electrode for increasing the luminous efficiency of the LED. Because the current blocking layer is below the top electrode, is light transparent, and extends beyond the perimeter of the top electrode, the current blocking layer prevents high current density in a region of the LED where any light emitted would be blocked by the nontransparent top electrode. The disclosure of Watanabe indicates that increased efficiency is achieved by preventing emission of light under the nontransparent electrode. The current is directed elsewhere so that the resulting generated light can escape the device. U.S. Pat. No. 7,247,985 to Koneko similarly suggests improved electrical energy conversion by providing two current blocking structures in an LED. A first current blocking structure is disposed directly under the top electrode in a central region. A second current blocking structure is disposed in an outer region surrounding the central region. The second region functions to define the shape of the light emitting region and Koneko says improved light-emission performance is achieved. The use of one current blocking structure or a pair of current blocking structures as disclosed in these patents may create some gains in efficiency but these prior art structures also have limitations.

FIG. 1 (Prior Art) is a cross-sectional side view of a conventional lateral LED device 1. Lateral LED device 1 includes a bond wire 2, p-electrode 3, Indium Tin Oxide ("ITO") transparent conductive layer 4, current blocking layer 5, p++GaN layer 6, p-GaN layer 7, active layer 8, n-GaN layer 9, growth substrate layer 10, n-electrode 11 and regions of non-uniform light generation 12. P-electrode 3 and n-electrode 11 are non-transparent metal layers. During operation of lateral LED device 1, a voltage is placed across p-electrode 3 and n-electrode 11 of lateral LED device 1 causing a current to flow from p-electrode 3 to n-electrode 11. This flow of current causes light to be generated in active layer 8. Current blocking layer 5 is a transparent insulating layer and is disposed between p-electrode 3 and light-emitting active layer 8 to prevent the emission of light under non-transparent metal p-electrode 3. Current blocking layer 5 thus prevents current flow and light emission in a portion of active layer 8 where overlying metal p-electrode 3 would obstruct the emitted light. Current flow is thus directed to other portions of active layer 8 which increases the luminous efficiency of the device. Because the resistance of ITO layer 4 and p-GaN layer 7 is higher than n-GaN layer 9, the current flowing from p-electrode 3 through n-GaN layer 9 tends to be concentrated at the edge of current blocking layer 5 nearest p-electrode 3. Current flow farther from p-electrode 3 is less dense and this disparity leads to non-uniform light generation 12, local heating from the concentration of electrical currents, and potential damage to lateral LED device 1.

FIG. 2 (Prior Art) is a cross-sectional side view of a conventional vertical LED device 20. Vertical LED device 20 includes: n-electrode 21, n-GaN layer 22, active layer 23, p-GaN layer 24, p++GaN layer 25, current blocking layer 26, highly reflective layer 27, encapsulant layer 28, barrier metal 29, bond metal layer 30, adhesion layer 31, conductive carrier 32, p-electrode 34, and regions of non-uniform light generation 35. During operation of the vertical LED device 20, a voltage is placed across the device such that current flows from metal p-electrode 34 to metal n-electrode 21. As current flows through active layer 23, light is generated. Current blocking layer 26 is disposed between p-electrode 34 and active layer 23 to prevent current flow and light emission under the non-transparent metal n-electrode 21. The highly reflective layer 27 is highly conductive, so the entire p++GaN region 25 to the right of current blocking layer 26 is essentially equipotential. The overlying n-GaN layer 22, however, is somewhat resistive and limits current spreading. Current density in regions closer to n-electrode 21 is therefore greater than current density in regions farther away from n-electrode 21. This disparity in current density causes non-uniform light generation 35 in vertical LED device 20. Moreover, the high current density closest to n-electrode 21 may cause local heating and damage to LED device 20. An LED device with improved luminous efficiency and uniform light generation is desired.

SUMMARY

In a first novel aspect, an LED device includes a strip-shaped electrode, a strip-shaped current blocking structure, a plurality of current blocking structures and a light emitting active layer. The plurality of current blocking structures are distributed in such a manner to prevent current flow to/from the strip-shaped electrode from concentrating in an area immediately adjacent the strip-shaped current blocking structure or in the area under the strip-shaped electrode. Instead, the plurality of current blocking structures are placed and distributed such that current flow in the light emitting active layer is substantially uniform in portions of the active layer that are not directly underneath the strip-shaped electrode.

In a second novel aspect, an LED device includes a strip-shaped electrode, a strip-shaped current blocking structure, a plurality of current blocking structures, a highly reflective metal layer, a p-GaN layer and a p++GaN layer. The strip-shaped current blocking structure and the plurality of current blocking structures are formed by etching away selected portions of the p++GaN layer to create relatively low conductive non-ohmic contacts between the highly reflective metal layer and the p-GaN layer. This etching away of portions of the p++GaN layer is performed by standard semiconductor processing techniques such as Reactive Ion Etching (RIE) or any other suitable processing method. In areas where the p++GaN is etched away from the surface of the p-GaN, current flow is impeded or blocked.

In a third novel aspect, an LED device includes a strip-shaped electrode, a strip-shaped current blocking structure, a plurality of distributed current blocking structures, and a layer of p-GaN. The strip-shaped current blocking structure and the plurality of distributed current blocking structures are formed by damaging selected portions of the p-GaN layer to create relatively high resistive portions within the p-GaN layer. High density plasma may be utilized to form the relatively high resistive portions by locally heating selected portions of the p-GaN layer. When an electric field is applied, the areas of damaged p-GaN portions impede or block current flow in such a way that current flow through the current blocking layer is distributed and spread. Current flow through the portion of the active layer that is not directly underneath the strip-shaped electrode is substantially uniform, whereas the strip-shaped current blocking structure effectively blocks current from flowing through the portion of the active layer that is directly underneath the strip-shaped electrode. Because the current flow through the active layer is substantially uniform in this way, substantially uniform light generation occurs in the active layer outside of the area underneath the strip-shaped electrode.

The entire current blocking layer can be considered together, where each unit area of the layer has a porosity (the amount of the area that is not covered or blocked by any current blocking structure as compared to the total area). This porosity is made to vary across the layer such that current flow through the active layer of the LED is substantially uniform in all areas of the active layer, except for those areas of the active layer disposed directly under an opaque object (such as a metal electrode) where there is substantially no current flow.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings. In the description and claims below, when a first layer is referred to as being disposed "over" a second layer, it is to be understood that the first layer can be directly on the second layer, or an intervening layer or layers may be present between the first and second layers. The terms such as "over", "under", "underneath", "upper", "lower", "top", "bottom", "upward", "downward", "vertically", and "laterally" are used herein to describe relative orientations between different parts of the LED being described, and it is to be understood that the overall LED structure being described can actually be oriented in any way in three-dimensional space.

Figure 1:
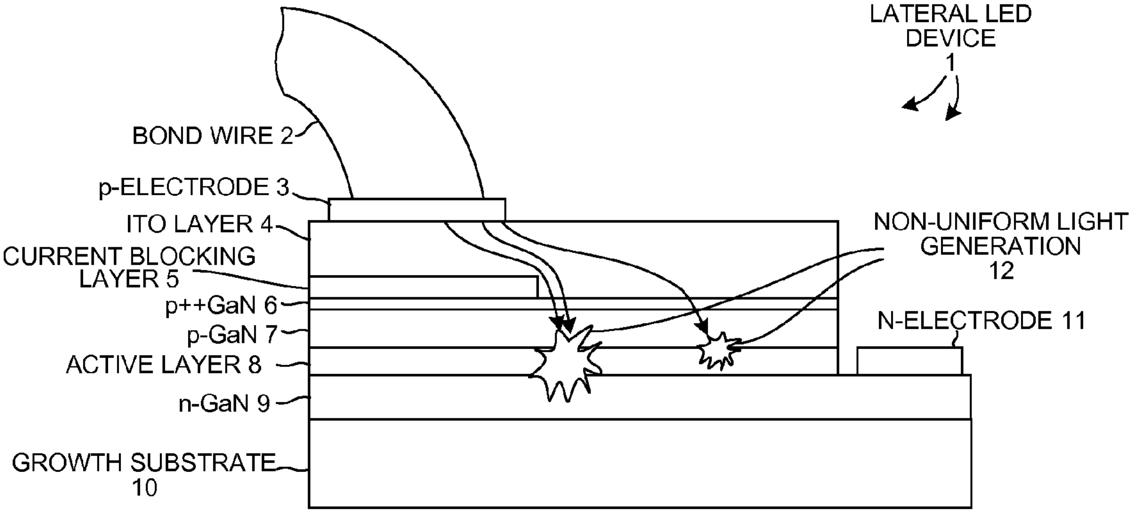
FIG. 1 (Prior Art) is a cross-sectional diagram of light generation in a lateral Light Emitting Diode (LED) device.
Figure 2:
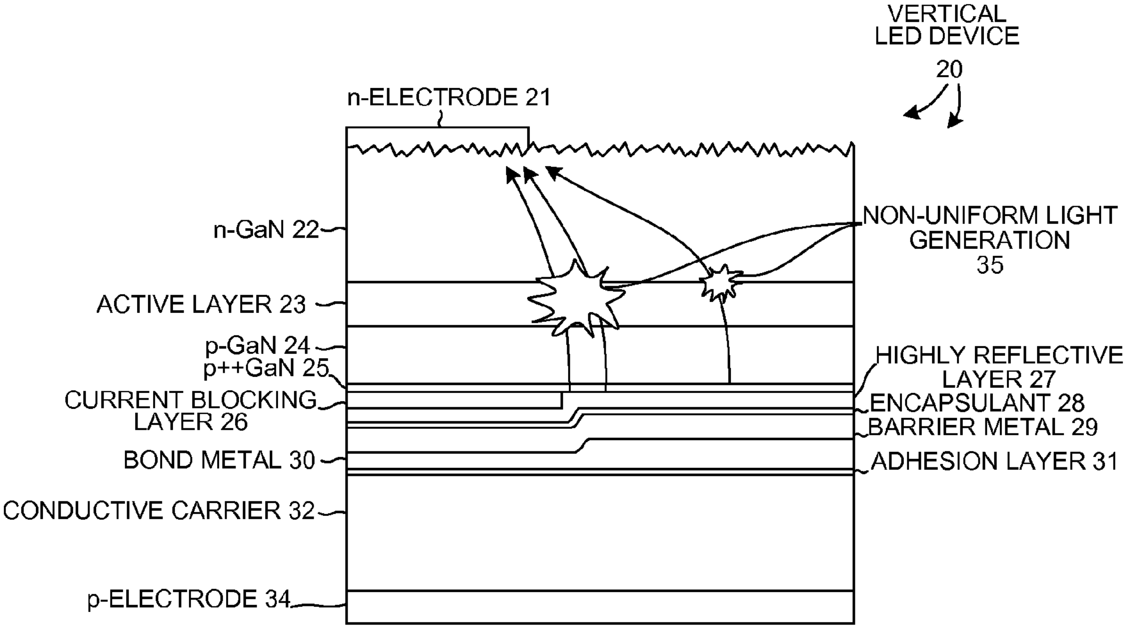
FIG. 2 (Prior Art) is a cross-sectional diagram of light generation in a vertical LED device.
Figure 3:
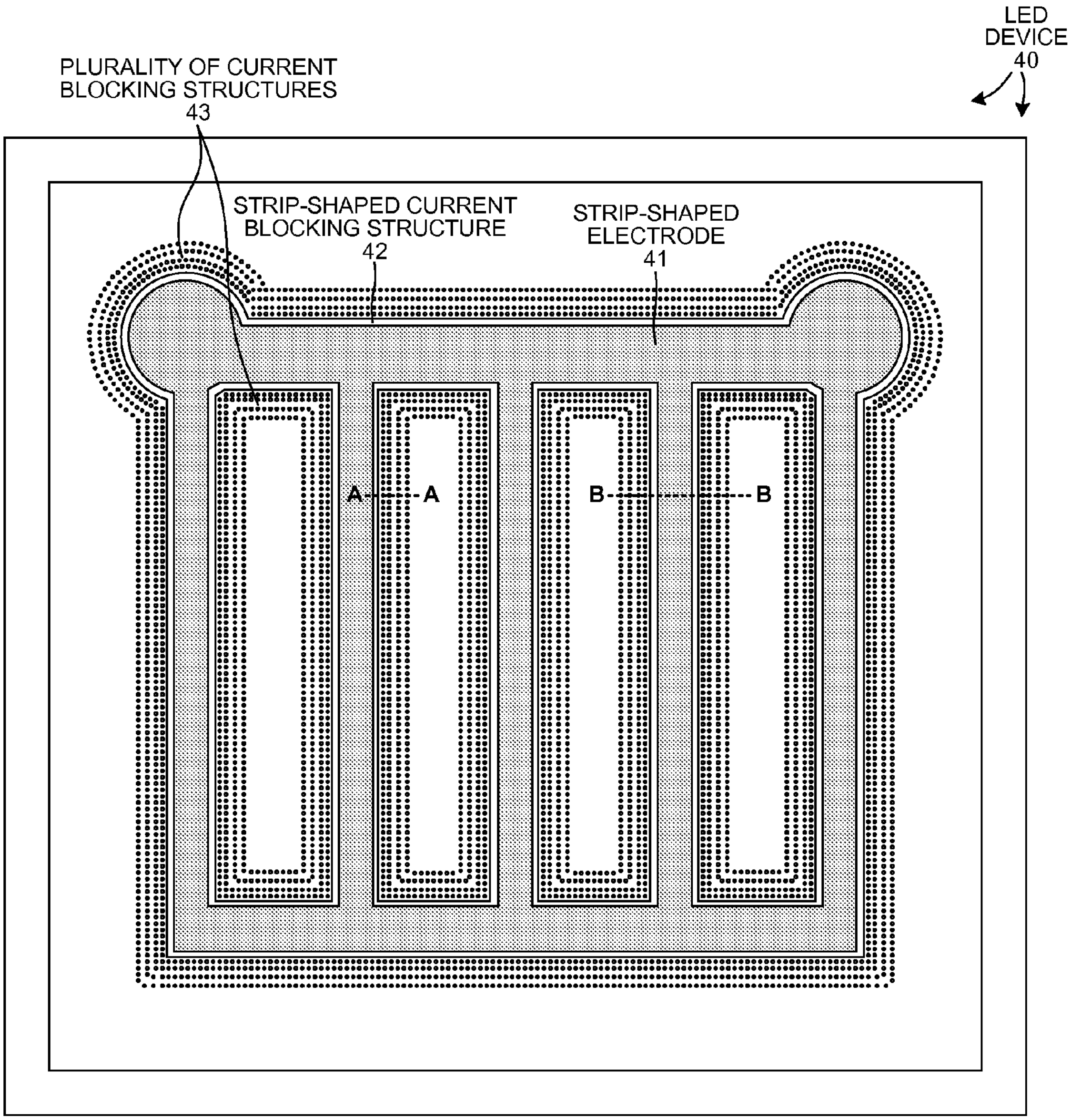
FIG. 3 is a top-down diagram of an LED device in accordance with one novel aspect.

FIG. 3 is a top-down diagram of an LED device 40. LED device 40 includes a strip-shaped electrode 41, a strip-shaped current blocking structure 42, and a plurality of current blocking structures 43. The plurality of current blocking structures 43 includes multiple rows of disc-shaped current blocking structures, "discs", disposed on each side of electrode 41 in the lateral dimension. The strip-shaped current blocking structure 42 and the plurality of current blocking structures 43 are disposed in a layer of the LED device 40 that is below the layer of the metal of electrode 41. Sectional line A-A is shown in FIG. 3 extending perpendicularly outward from a strip-shaped portion of electrode 41. Sectional line B-B is also shown in FIG. 3 and line B-B perpendicularly dissects another strip-shaped portion of electrode 41.

Figure 4:
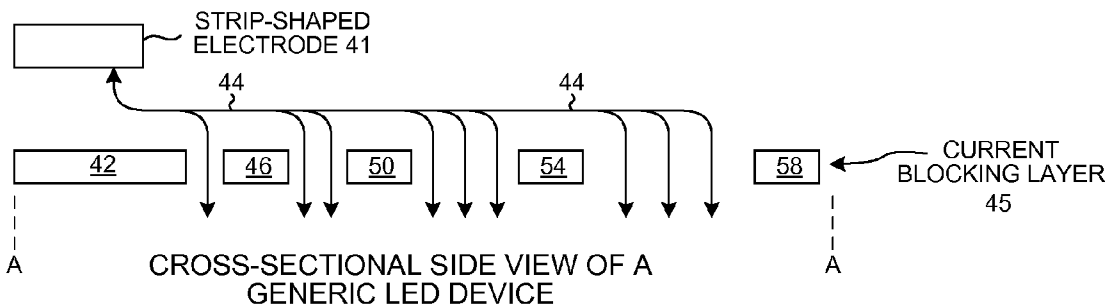
FIG. 4 is a simplified conceptual cross-sectional diagram of a generic LED device structure in accordance with one novel aspect.

FIG. 4 is a simplified conceptual cross-sectional diagram of a generic LED device. This LED device may either be a vertical LED device or a lateral LED device. In the case of the LED of FIG. 4 being a vertical LED device, current 44 flows from a p-electrode (not shown) below the structure shown, up through the current blocking layer 45, then through an p-GaN layer (not shown), a light generating active layer (not shown), an n-GaN layer (not shown), and to the strip-shaped electrode 41. In the case of the LED of FIG. 4 being a lateral LED device, current 44 flows from strip-shaped electrode 41, laterally through a transparent conductor layer (not shown), then vertically down through the current blocking layer 45, then through a p-GaN layer (not shown), an active layer (not shown), an n-GaN layer (not shown), and to an n-electrode (not shown). In both cases, the current blocking layer 45 includes the strip-shaped current blocking structure 42 and the plurality of current blocking structures 43. Four of the plurality of current blocking structures (46, 50, 54, 58) are illustrated in cross-section in FIG. 4. Strip-shaped current blocking structure 42 is disposed directly underneath metal strip-shaped electrode 41, but is slightly wider than strip-shaped electrode 41. Strip-shaped current blocking structure 42 blocks current from flowing through the portion of the active layer (not shown) directly underneath the strip-shaped electrode 41. Consequently substantially no light is emitted in the portion of the active layer directly underneath strip-shaped electrode 41.

Figure 5:
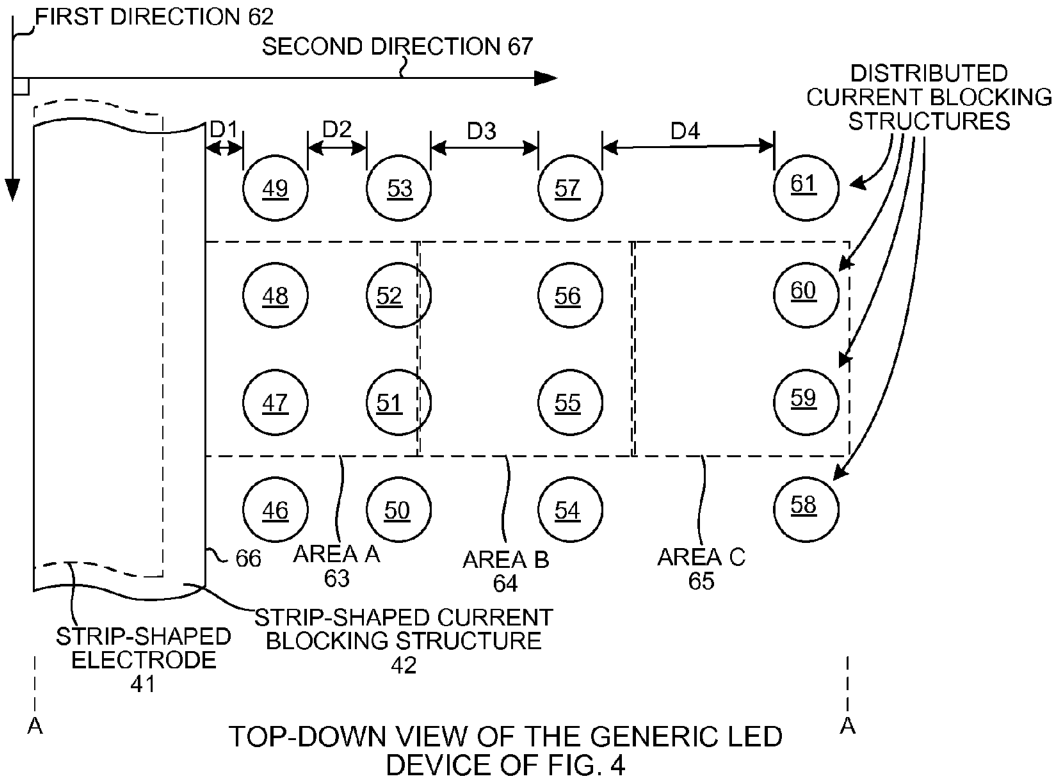
FIG. 5 is a top-down diagram of the generic LED device structure of FIG. 4.

FIG. 5 is a top-down diagram of the generic LED device of FIG. 4. The strip-shaped electrode 41 and the strip-shaped current blocking structure 42 extend lengthwise in a first direction 62. FIG. 5 also illustrates three square areas: area A 63, area B 64, and area C 65. These three square areas A, B, and C abut each other and extend in a row away from the right edge 66 of the strip-shaped current blocking structure 42. The three square areas extend in a row extending to the right in the illustration in a second direction 67 perpendicular to first direction 62. The strip-shaped current blocking structure 42 and the plurality of current blocking structures 46-61 are separate features formed from a layer of an insulating material. The current blocking structures 46-61 are disposed in a two-dimensional array as illustrated. In one example, the separate features are 200 nm thick separate features of silicon dioxide. In other embodiments, strip-shaped current blocking structure 42 and current blocking structures 46-61 are separate features of silicon nitride. The strip-shaped current blocking structures 46-61 can also be made of other insulative materials.

In the illustrated example, current blocking structures 46-61 are discs approximately five microns in diameter. Discs 46-49 are aligned in a first row that extends parallel to first direction 62 as illustrated. Discs 50-53 are aligned in a second row that extends parallel to the first row as illustrated. Discs 54-57 are aligned in a third row that extends parallel to the first and second rows as illustrated. Discs 58-61 are aligned in a fourth row that extends parallel to each of the first, second and third rows as illustrated. The first row of discs is spaced a first distance D1 away from the right edge 66 of strip-shaped current blocking structure 42 in the second direction 67. The second row of discs is spaced a second distance D2 from the first row of discs in the second direction 67. The third row of discs is spaced a third distance D3 from the second row in the second direction 67. The fourth row of discs is spaced a fourth distance D4 from the third row in the second direction 67. In one embodiment, D4 is greater than D3, and D3 is greater than D2, and D2 is greater than D1.

Area A 63, area B 64, and area C 65 are square shaped areas. In the specific illustrated embodiment, each of these areas is a square area four hundred square microns in size. At least a first one of the plurality of current blocking structures 43 covers a portion of area A (covers X percent of area A). At least a second one of the plurality of current blocking structures 43 covers a portion of area B (covers Y percent of area B). At least a third one of the plurality of current blocking structures 43 covers a portion of area C (covers Z percent of area C). In the illustrated case, X percent is greater than Y percent, and Y percent is greater than Z percent.

Figure 6:
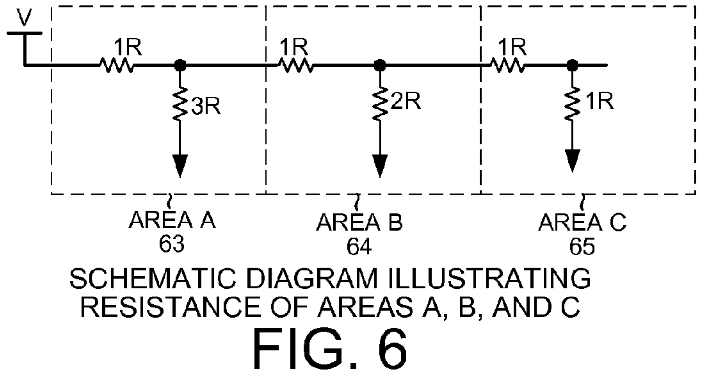
FIG. 6 is a simplified conceptual diagram illustrating the resistances of area A, area B and area C in the generic LED device structure of FIG. 5.

FIG. 6 is a simplified conceptual diagram illustrating the resistances of area A 63, area B 64 and area C 65. In this illustration, each of the three areas A, B, and C, contains two resistors. The value of the first resistor, 1R, in each area represents the lateral resistance through a conductive layer or layers disposed above the plane of the current blocking structures (between the plane of the top of current blocking structures and the plane of the bottom of the strip-shaped electrode). In the example of the generic device being a vertical LED device, the conductive layers above layer 45 of the current blocking structures include a p++GaN layer, a p-GaN layer, an active layer, and an n-GaN layer. In the example of the generic device being a lateral LED device, the conductive layers above the layer of the current blocking structures include a transparent conductor layer (for example, Indium Tin Oxide).

The second resistor in each area represents the vertical resistance that electrical current will pass through as it flows vertically between the features of the current blocking layer 45. Because area A includes the highest percentage area of current blocking discs, X percent, the vertical resistance of area A is 3R in this illustration. This value, 3R, is greater than the vertical resistance of area B which is 2R, and the vertical resistance of area C which is 1R. When the laterally oriented 1R resistances are considered along with the vertically oriented resistances 3R, 2R and 1R, the overall resistance between the strip-shaped electrode 41 through any of the three areas, A, B, and C is equal to 4R. Therefore the amount of current flowing through the active light emitting region of the LED device from or to any of the three areas is substantially the same. The resistance values 1R, 2R and 3R in the diagram of FIG. 6 are not measured values, but rather are presented in the diagram only for conceptual illustrative purposes.

Figure 7:
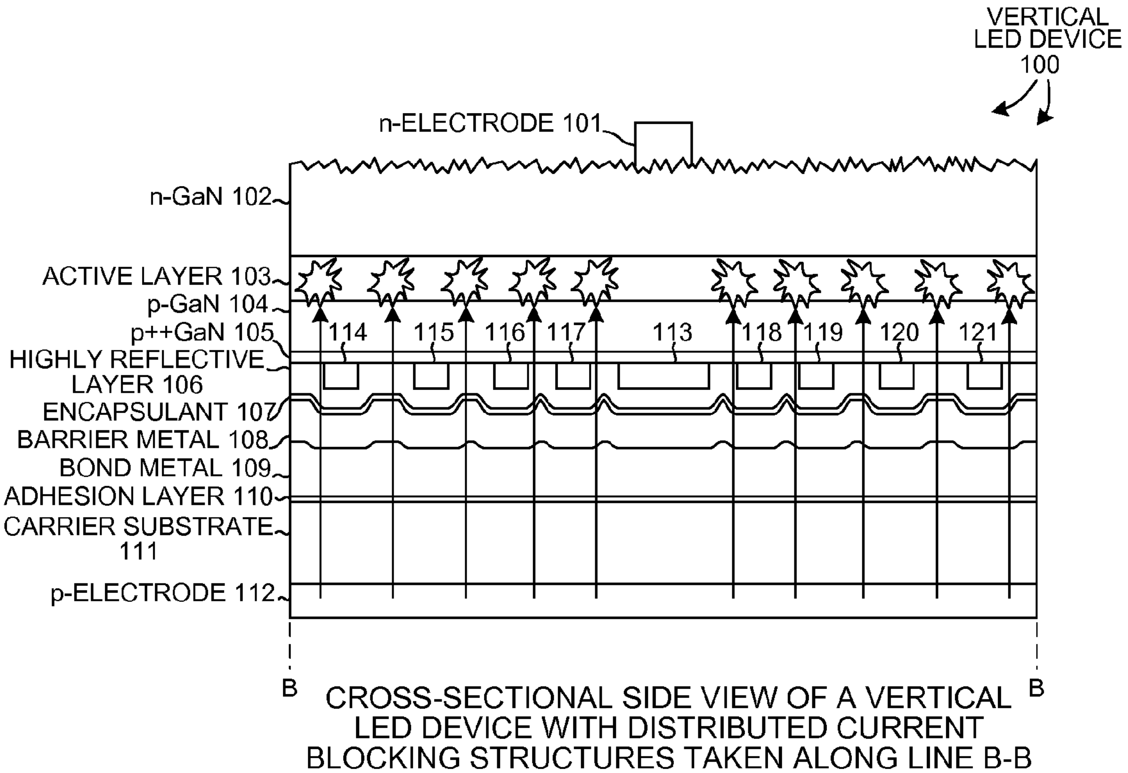
FIG. 7 is a cross-sectional side view of a vertical LED device having a plurality of current blocking structures that are sized and distributed so that a uniform amount of light is generated across the active layer (except in portions of the active layer under an opaque electrode where the current blocking layer effectively prevents light generation).

FIG. 7 is a cross-sectional diagram of a portion of a vertical LED device 100. The cross-sectional view of FIG. 7 may, for example, represent the cross-section B-B in the structure of FIG. 3. Vertical LED device 100 includes metal n-electrode 101, n-GaN layer 102, active layer 103, p-GaN layer 104, p++GaN layer 105, highly reflective layer 106, encapsulant layer 107, barrier metal layer 108, bond metal layer 109, adhesion layer 110, carrier substrate 111, p-electrode 112, strip-shaped current blocking structure 113 and a plurality of distributed current blocking structures 114-121. The n-GaN layer 102 is approximately 5000 nm thick and makes contact with n-electrode 101. Active layer 103 is approximately 130 nm thick and is disposed between n-GaN layer 102 and a 300 nm thick layer of p-GaN 104. The p-GaN layer 104 is directly above a 20 nm thick p++GaN layer 105. The current blocking structures 113-121 are disposed between the p++GaN layer 105 and highly reflective layer 106 and are created by depositing a 200 nm thick insulating layer of silicon dioxide or silicon nitride on the p++GaN layer and then patterning and etching the insulating layer using standard processing techniques such as RIE.

After etching of the insulating layer to form the current blocking structures, the 200 nm thick highly reflective layer 106 is formed over the current blocking structures. The 100 nm thick layer of encapsulant 107 is formed over the highly reflective layer 106. The barrier metal layer 108 is then added. Barrier metal layer is a single layer of titanium more than 50 nm thick. Bond metal 109 is provided to bond the structure above the bond metal layer to the structure below the bond metal layer. The structure below the bond metal layer includes adhesion layer 110, carrier substrate 111, and p-electrode 112. Adhesion layer 110 is 200 nm thick. Carrier substrate 111 is 150,000 nm thick. The metal p-electrode 112 covers the entire bottom surface of carrier substrate 111 as illustrated and is approximately 200 nm thick.

When vertical LED device 100 of FIG. 7 is emitting light, a voltage is present between the metal electrodes 112 and 101. Current flows from metal p-electrode 112, up through carrier substrate 111, through adhesion layer 110, bond metal layer 109, barrier metal layer 108, encapsulant layer 107, highly reflective layer 106, p++GaN 105, and p-GaN layer 104 into light-emitting active layer 103. Current is blocked from flowing into the portion of active layer 103 underneath n-electrode 109 by strip-shaped current blocking structure 113. No light is therefore generated in the portion of the active layer directly underneath n-electrode 101. In all other portions of active layer 103, a substantially uniform amount of light is emitted. The current blocking structures 114-121 that are closer to the strip-shaped current blocking structure 113 are spaced closer to one another, and the spacing between adjacent current blocking structures increases extending laterally away from the strip-shaped current blocking structure 113. Note, for example, that current blocking structure 118 is spaced relatively close to the right edge of strip-shaped current blocking structure 113, whereas current blocking structure 121 is spaced relatively farther away from the right edge of current blocking structure 120. The layer of the current blocking structures 113-121 is only 320 nm away from active layer 103, whereas the active layer 103 is approximately 5000 nm from the n-electrode 101. Lateral current flow occurs primarily through the thick n-GaN layer 102.

Figure 8:
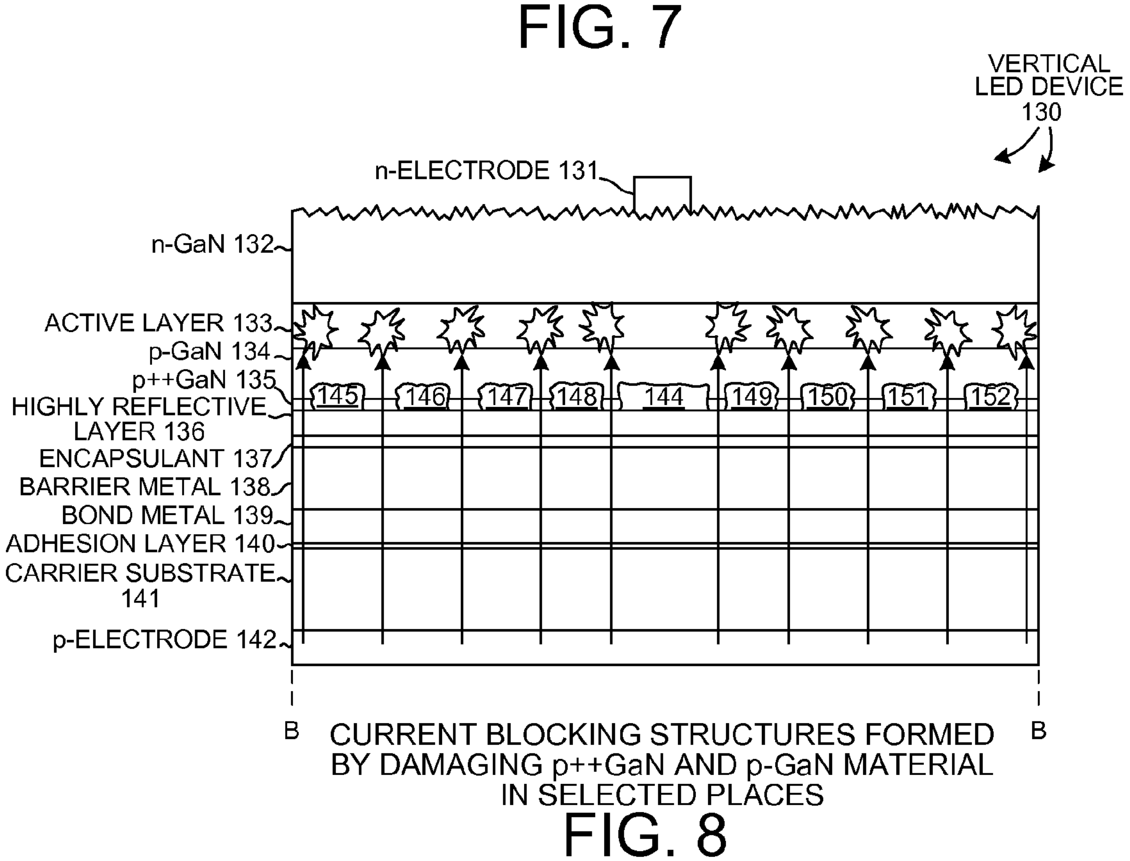
FIG. 8 is a cross-sectional side view of a vertical LED device where the distributed current blocking structures are formed by damaging selected portions of the p++GaN and p-GaN layers.

FIG. 8 is a cross-sectional diagram of an embodiment of a vertical LED device 130 where the current blocking structures are formed by damaging p++GaN and p-GaN material. For example, after n-GaN layer 132, active layer 133, p-GaN layer 134, and p++GaN layer 135 have been formed, a high density plasma may be utilized to locally heat the p++GaN 135 and p-GaN 134 layers in desired locations. This causes damage to the p++GaN and p-GaN layers in the selected places and increases the resistivity of the p++GaN and p-GaN material in these desired locations. In the remainder of the LED manufacturing process, the highly reflective layer 136 is formed over the p++GaN layer 135. A layer 137 of encapsulant is then formed over the high reflective layer, and a barrier metal layer 138 is formed over the encapsulant to form a device wafer structure. The carrier 141 is then wafer bonded to the device wafer structure via bond metal 139. The original substrate upon which layers 132-135 were grown is then removed, and electrodes 142 and 131 are added.

The damaged portions of the p++GaN and p-GaN layers of FIG. 8 are identified by reference numerals 144-152. The damaged portions are relatively less conductive than are the other undamaged portions of the p-GaN and p++GaN layers. Due to the lateral placement and spacing of these relatively less conductive portions 144-152, electrical current in the lateral dimension is distributed uniformly where the current flows vertically through the active layer 133, except for the portion of the active layer disposed directly underneath electrode 131 where there is no current flow through the active layer. Light generation is therefore substantially uniform in all areas of the active layer except for the area under electrode 131.

Figure 9:
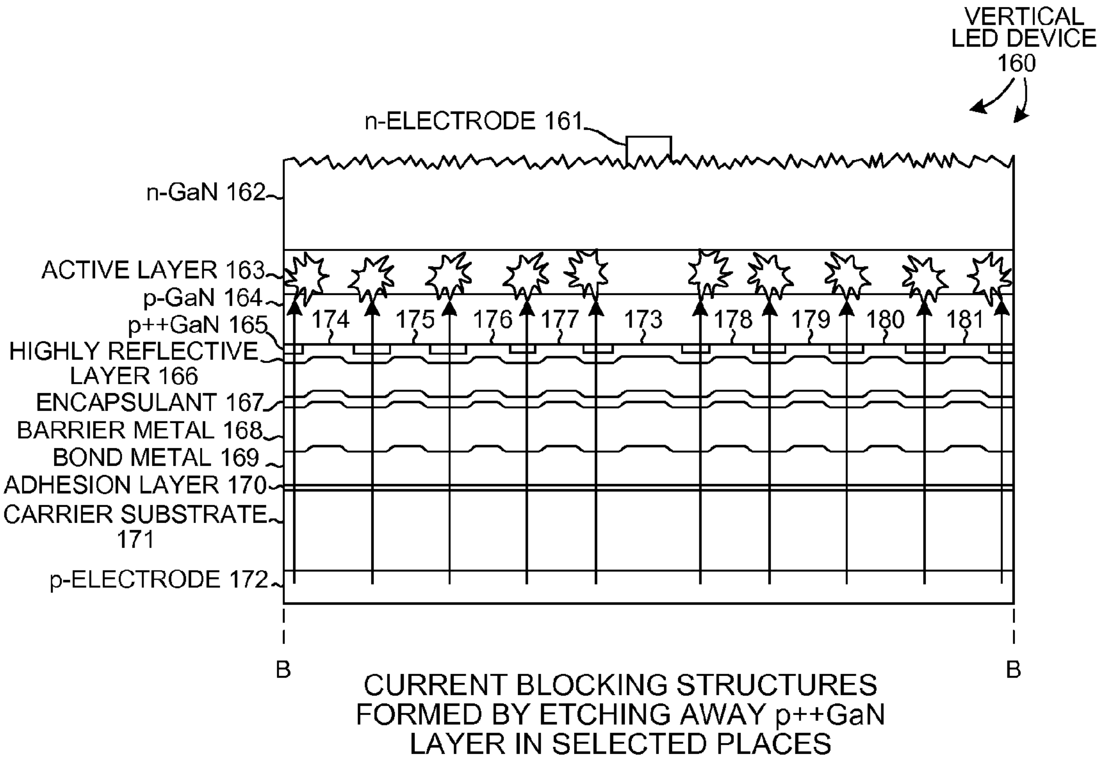
FIG. 9 is a cross-sectional side view of a vertical LED device where the distributed current blocking structures are formed by etching away selected portions of the p++GaN layer.

FIG. 9 is a cross-sectional diagram of an embodiment of a vertical LED device 130 where the current blocking structures are formed by etching away selected portions of the p++GaN layer. The epitaxial layers 162-165 of the LED are grown on a substrate to make the device wafer structure as described above. After the p++GaN layer 165 is formed, the current blocking structures 173-181 are formed by etching away selected portions of the highly doped p++GaN layer 165 to create non-ohmic contact regions between metal 166 and p-GaN layer 164. Etching away of portions of the p++GaN layer 165 is performed by standard semiconductor processing techniques such as Reactive Ion Etching (RIE) or another suitable processing method. After the formation of the current blocking structures 173-181, the highly reflective layer 166 is formed over the p++GaN layer 165, and layer 167 of encapsulant is formed over the highly reflective layer, and a barrier layer 168 is formed over the encapsulant to form a device wafer structure. The carrier 171 is then wafer bonded to the device wafer structure via a layer of bond metal 169. The original substrate of the device wafer structure is then removed, and electrodes 172 and 161 are added.

In the regions where the p++GaN layer was etched away, current flow will be blocked or impeded due to the poor contact between metal of the highly reflective layer 166 and the p-GaN layer 164. Current will, however, be encouraged to flow where highly conductive metal layer 166 makes a good low-resistance ohmic contact with p++GaN layer 165.

Figure 10:
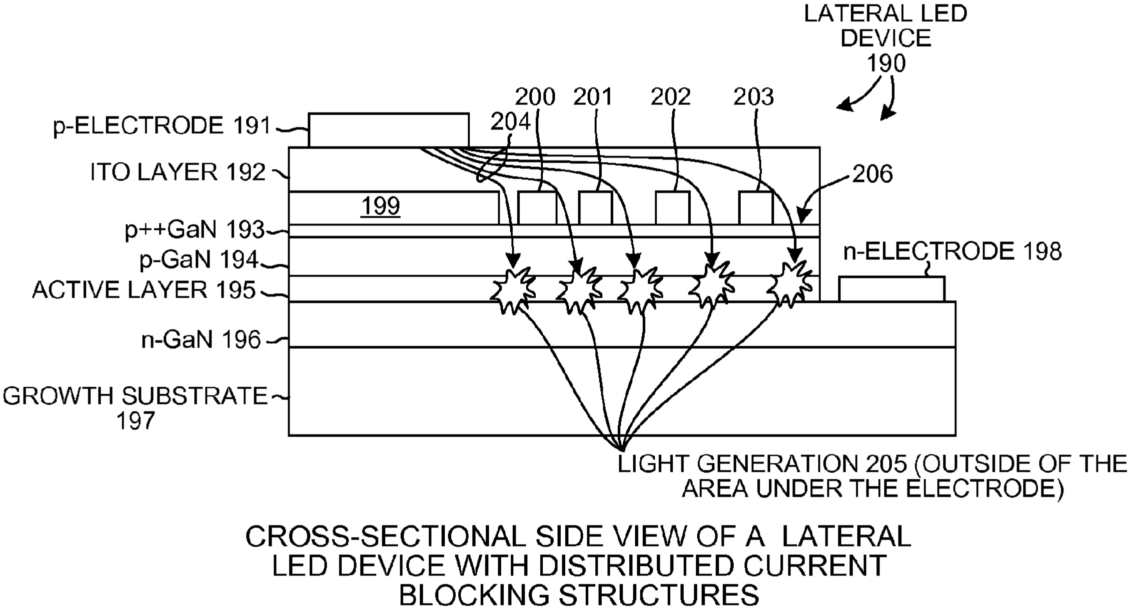
FIG. 10 is a cross-sectional diagram of a lateral LED device having a plurality of distributed current blocking structures.

FIG. 10 is a cross-sectional diagram of a part of a lateral LED device 190 that includes distributed current blocking structures in accordance with one novel aspect. Lateral LED device 190 includes metal p-electrode 191, a transparent conductor layer 192 (for example, Indium Tin Oxide), p++GaN layer 193, p-GaN layer 194, active layer 195, n-GaN layer 196, growth substrate 197, metal n-electrode 198, strip-shaped current blocking structure 199, and a plurality of current blocking structures 200-203. A distributed flow of current 204 is shown passing down between adjacent current blocking structures 199-203. Areas of light generation 205 are also shown. These areas of light generation 205 are not directly under p-electrode 191.

To cause the lateral LED device 190 of FIG. 10 to emit light, a voltage is placed across metal p-electrode 191 and n-electrode 198. Current flows from p-electrode 191, through ITO layer 192, p++GaN layer 193, p-GaN layer 194, active layer 195, and n-GaN layer 196 to n-electrode 198. The current blocking structures 199-203 are distributed across a planar surface 206 of p++GaN layer 193. Strip-shaped current blocking structure 199 is directly under metal p-electrode 191 and prevents electrical current flow from p-electrode 191 into the region of the active layer below strip-shaped current blocking structure 199. Instead, the current flows laterally through ITO layer 192 and into p++GaN layer 193 in areas that are not covered by current blocking structures. The current blocking structures 199-203 are spaced from each other such that light generation 205 in the portion of the active layer 195 that is not directly underneath p-electrode 191 is substantially uniform, whereas there is substantially no light generated in the portion of the active layer 195 that is directly underneath p-electrode 191.

Figure 11:
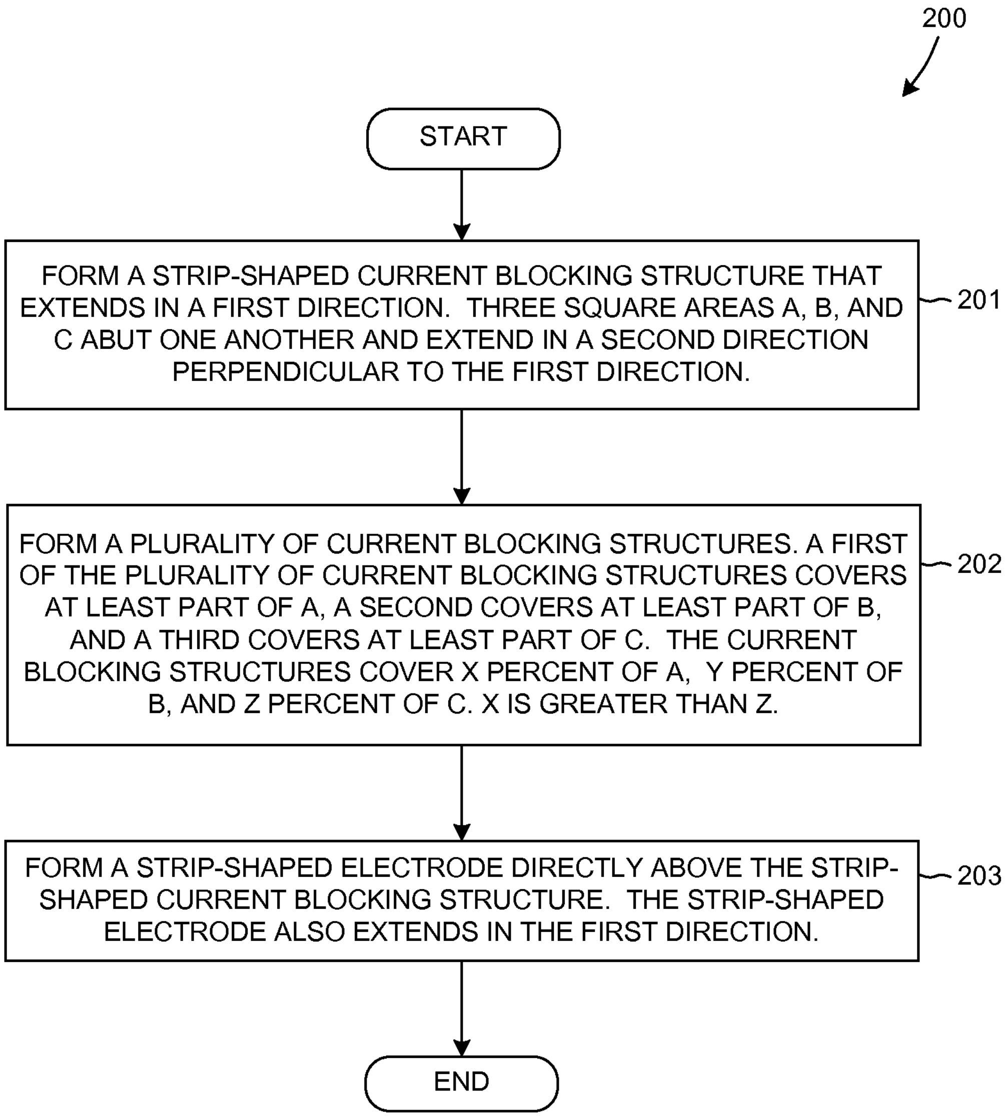
FIG. 11 is a flowchart of a method in accordance with one novel aspect.

FIG. 11 is a flowchart of a method 200 in accordance with a first novel aspect. An LED is manufactured by forming a strip-shaped current blocking structure (step 201). The strip-shaped current blocking structure extends in a first direction, wherein a first square area A, a second square area B, and a third square area C abut one another and extend in the order A, B, C in a row in a second direction perpendicular to the first direction and away from the strip-shaped current blocking structure. Each of areas A, B and C is a square area of 400 square microns.

A plurality of current blocking structures is formed (step 202) such that at least a first one of the plurality of current blocking structures covers at least part of A, such that at least a second one of the plurality of current blocking structures covers at least part of B, such that least a third one of the plurality of current blocking structures covers at least part of C. The plurality of current blocking structures covers X percent of A, covers Y percent of B, and covers Z percent of C. In one specific example, X>Z. See, for example, the specific distribution of the disc-shaped current blocking structures in FIG. 5, where X>Y>Z.

A strip-shaped electrode is formed (step 203) so that the strip-shaped electrode is disposed directly above the strip-shaped current blocking structure. Current flow through the strip-shaped electrode causes light to be emitted from the LED.

In one example of the method 200 of FIG. 11, the strip-shaped current blocking structure is strip-shaped current blocking structure 42 of FIG. 5, the plurality of current blocking structures is the plurality of current blocking structures 46-61 of FIG. 5, and the strip-shaped electrode is the strip-shaped electrode 41 of FIG. 5. The strip-shaped electrode 41 is narrower than the underlying strip-shaped current blocking structure 42. Although the strip-shaped electrode is illustrated in the flow of FIG. 11 as being formed after the strip-shaped current blocking structure and after the plurality of current blocking structures, this flow is exemplary and is presented just for illustrative purposes. In some examples, the strip-shaped electrode is formed before the forming of the strip-shaped current blocking structure and before the forming of the plurality of current blocking structures.

In one example, the forming of the strip-shaped current blocking structure of step 201 and the forming of the plurality of current blocking structures of step 202 is accomplished by impairing or destroying selected areas of a p++GaN layer and a p-GaN layer. In another example, the forming of the strip-shaped current blocking structure of step 201 and the forming of the plurality of current blocking structures of step 202 is accomplished by etching away selected areas of a p++GaN layer to form selected areas of non-ohmic contact.

Although certain specific embodiments are described above for instructional purposes, the teachings of this patent document have general applicability and are not limited to the specific embodiments described above. The plurality of current blocking structures can be sized and spaced in many ways. Some of the plurality of current blocking structures can be of one size, whereas others can be of another size. Some of the plurality of current blocking structures can be of one shape, whereas others can be of another shape. In one example, the current density of an area is decreased by increasing the size of the blocking structures where the distance between the structures, center to center, is constant. In another example, the current density of an area is decreased by decreasing the space between adjacent current blocking structures of the same size. Although not shown in FIG. 5, the separation between adjacent current blocking structures of a vertically-extending row can be made to increase as a function of how far the row is separated from the vertically-extending edge 66 of the strip-shaped current blocking structure 42. The farther the row is separated from edge 66, the more the separation between current blocking structures of the row.

In one example, the current blocking layer is a mesh or other unitary structure having holes rather than a plurality of separate features. The porosity of such a mesh current blocking layer is varied extending laterally across the LED so that current flow through the active layer of the LED is substantially uniform, except for in areas of the active layer disposed directly underneath an opaque metal electrode where there is substantially no current flow. Accordingly, various modifications, adaptations, and combinations of various features of the described embodiments can be practiced without departing from the scope of the invention as set forth in the claims.

What is claimed is:

1. A light emitting device comprising:

a semiconductor layer;

a strip-shaped electrode formed on the semiconductor layer and including at least one closed opening having a rectangular shape in a plan view, wherein a current flowing through the strip-shaped electrode causes light to be emitted from the light emitting device;

a strip-shaped current blocking structure disposed directly underneath the strip-shaped electrode;

a first row of a plurality of current blocking structures formed along a periphery of the closed opening; and a second row of a plurality of current blocking structures formed parallel to the first row such that the first row is disposed between the second row and the strip-shaped current blocking structure, wherein a proportion of a region covered by the plurality of current blocking structures decreases in a direction away from the strip-shaped current blocking structure in the plan view, and the plurality of current blocking structures are formed inside the closed opening in the plan view.

2. The light emitting device of claim 1, wherein the plurality of current blocking structures are formed along four sides of the rectangular shape of the closed opening in the plan view.

3. The light emitting device of claim 1, wherein a first distance between the strip-shaped current blocking structure and the first row is smaller than a second distance between the first row and the second row.

4. The light emitting device of claim 1, wherein the strip-shaped electrode includes a plurality of the closed openings, and the plurality of current blocking structures including the first row and the second row are formed inside each of the closed openings in the plan view.

5. The light emitting device of claim 1, wherein the closed opening is surrounded by the strip-shaped electrode in the plan view.

6. A light emitting device comprising:

a semiconductor layer;

a strip-shaped electrode formed on the semiconductor layer and including at least one closed opening having a rectangular shape in a plan view, wherein a current flowing through the strip-shaped electrode causes light to be emitted from the light emitting device;

a strip-shaped current blocking structure disposed directly underneath the strip-shaped electrode;

a first row of a plurality of current blocking structures formed along a periphery of the closed opening; and a second row of a plurality of current blocking structures formed parallel to the first row such that the first row is disposed between the second row and the strip-shaped current blocking structure, wherein a proportion of a region of the semiconductor layer through which the current flows increases in a direction away from the strip-shaped electrode in the plan view, and the plurality of current blocking structures are formed inside the closed opening in the plan view.

7. The light emitting device of claim 6, wherein the plurality of current blocking structures are formed along four sides of the rectangular shape of the closed opening in the plan view.

8. The light emitting device of claim 6, wherein a first distance between the strip-shaped current blocking structure and the first row is smaller than a second distance between the first row and the second row.

9. The light emitting device of claim 6, wherein the strip-shaped electrode includes a plurality of the closed openings, and the plurality of current blocking structures including the first row and the second row are formed in each of the closed openings.

10. The light emitting device of claim 6, wherein the closed opening is surrounded by the strip-shaped electrode in the plan view.

11. A light emitting device comprising:

a semiconductor layer;

a rectangular strip-shaped electrode formed on the semiconductor layer and including at least one closed opening having a rectangular shape in a plan view, the rectangular strip-shaped electrode having a long side in a first direction and a short side in a second direction;

a strip-shaped current blocking structure disposed underneath the strip-shaped electrode; and a plurality of current blocking structures disposed on a surface of the semiconductor layer along with the strip-shaped current blocking structure, wherein the proportion of the surface covered by the plurality of current blocking structures decreases in the second direction, wherein the plurality of current blocking structures are formed inside the closed opening in the plan view.

12. The light emitting device of claim 11, wherein each of the plurality of current blocking structures has a disc shape.

13. The light emitting device of claim 11, wherein a current from the strip-shaped electrode flows between the current blocking structures such that the current flowing through the surface is substantially uniform in areas not underneath the strip-shaped electrode.

14. The light emitting device of claim 11, further comprising one or more intervening layers between the strip-shaped electrode and the strip-shaped current blocking structure.

15. The light emitting device of claim 11, wherein the plurality of current blocking structures are plasma damaged regions of the semiconductor layer.

16. The light emitting device of claim 11, wherein the plurality of current blocking structures are formed along four sides of the rectangular shape of the closed opening in the plan view.

17. The light emitting device of claim 11, wherein the closed opening is surrounded by the rectangular strip-shaped electrode in the plan view.

* * * * *